(12) United States Patent
Sato

(10) Patent No.: US 6,888,304 B2
(45) Date of Patent: May 3, 2005

(54) DISPLAY MODULE

(75) Inventor: Toshihiro Sato, Mobara (JP)

(73) Assignee: Hitachi, Ltd., Tokyo (JP)

( * ) Notice: Subject to any disclaimer, the term of this patent is extended or adjusted under 35 U.S.C. 154(b) by 427 days.

(21) Appl. No.: 10/102,910

(22) Filed: Mar. 22, 2002

(65) Prior Publication Data

US 2002/0140643 A1 Oct. 3, 2002

(30) Foreign Application Priority Data

Mar. 28, 2001 (JP) ........................................ 2001-092818

(51) Int. Cl.[7] ................................................. H01J 1/62
(52) U.S. Cl. ..................................... 313/498; 313/506
(58) Field of Search ................................ 313/498, 500, 313/505, 506, 512

(56) References Cited

U.S. PATENT DOCUMENTS 6,330,044 B1   12/2001   Murade

2002/0153844 A1   10/2002   Koyama

FOREIGN PATENT DOCUMENTS

| JP | 10-301100 | 11/1998 |
|----|-----------|---------|
| JP | 2001-5426 | 1/2001  |

*Primary Examiner*—Vip Patel
(74) *Attorney, Agent, or Firm*—Antonelli, Terry, Stout & Kraus, LLP

(57) ABSTRACT

This display module prevents the leakage current generated between a first electrode layer and a second electrode layer that constitute a pixel via an organic light emitting layer and obtains uniform luminance. An interlayer insulation layer ILI is provided between an edge of a first electrode layer AD and an organic light emitting layer OLE that constitute the pixel and the distance between the edge and a second electrode layer CD is secured sufficiently. Further, the interlayer insulation layer ILI is coated with a resin material having fluidity and flatness is improved as a whole. An aperture that accommodates the organic light emitting layer OLE is formed in this interlayer insulation layer ILI and the coated organic light emitting layer OLE is formed in uniform thickness and through a necessary and sufficient spread.

7 Claims, 14 Drawing Sheets

DISPLAY MODULE

FIELD OF THE INVENTION

The present invention relates to an active matrix type display module, and, more particularly, to a display module provided with a pixel composed of an emitting device, such as an electro luminescence element or an LED (light emitting diode) that emits light by applying the current to an emitting layer, such as an organic semiconductor thin film and a pixel circuit that controls the light emission operation of this pixel.

BACKGROUND OF THE INVENTION

In recent years, with the advent of advanced information society, the demand of a personal computer, a car navigation system, a portable terminal unit, a telecommunications system or these combined products is increasing. A thin, lightweight, and low power consumption display device is suitable for a display means of these products and a liquid crystal display module or a display module that uses an electrooptic element, such as a self light emission type EL element or an LED is used.

The display module that uses the self light emission type electrooptic element of the latter is provided with features, such as good visibility, a wide viewing angle, and suitability for a motion image display with a fast response, and is assumed to be suitable for an image display in particular.

A display that uses an organic EL element (also called an organic light emitting diode, and may also be hereinafter abbreviated to an OLED) of which the emitting layer has organic matter in recent years is greatly expected as an OLED display in cooperation with a rapid improvement of luminous efficiency and the progress of network technology that enables visual communication. The OLED display has the diode structure in which an organic light emitting layer is sandwiched between two electrodes.

In order to increase the power efficiency in the OLED display constituted using such OLED, as described later, an active matrix driving method in which a thin film transistor (hereinafter referred to as a TFT) is used as a switching element of a pixel is effective.

An art that drives an OLED display in the active matrix structure is described in Japanese Patent Application Laid-open No. HEI04-328791, Japanese Patent Application Laid-open No. HEI08-241048, or the U.S. Pat. No. 5,550,066, for example, and an art related to a driving voltage is disclosed in International Publication No. WO98/36407.

A typical pixel structure of the OLED display has a pixel driving circuit (also hereinafter referred to as a pixel circuit) including two TFTs (the first TFT is a switching transistor and the second TFT is a driver transistor) that are first and second active elements and a storage capacitance (data signal holding element, that is, a capacitor), and this pixel circuit controls the emitting luminance of an OLED. A pixel is arranged in each intersection unit in which M data lines to which a data line (or an image signal) is supplied and N scanning lines (also hereinafter referred to as gate lines) to which a scanning signal is supplied are arranged in a matrix of N rows multiplied by M columns.

For the drive of a pixel, a scanning signal (gate signal) is sequentially supplied to N rows of gate lines and a switching transistor is set to the on state (turned on). Subsequently, the scanning in the vertical direction is finished once within a one-frame period Tf and a turn-on voltage is re-supplied to the first (first-row) gate line.

In this driving scheme, the time when the turn-on voltage is supplied to a gate line is less than Tf/N. Usually, about one sixtieth second is used as the value of the one-frame period Tf. While the turn-on voltage is being supplied to a certain gate line, all switching transistors connected to the data line are set to the on state, and a data voltage (image voltage) is supplied to M columns of data lines simultaneously or sequentially synchronizing with the on state. This is usually used by an active matrix liquid-crystal display.

A data voltage is stored (held) in a storage capacitance (capacitor) while a turn-on voltage (hereinafter, turn-on is also merely referred to as ON. Equally, turn-off is also merely referred to as OFF) is supplied to a gate line, and is kept in almost their value for a one-frame period (or one-field period). The voltage value of the storage capacitance specifies the gate voltage of a driver transistor.

Accordingly, the value of the current that flows into the driver transistor is controlled and light emission of an OLED is controlled. The response time until voltage is applied to the OLED and the light emission starts is usually less than 1 $\mu$s, and even an image (motion image) of a quick movement can be followed up.

Incidentally, in an active matrix driving method, because light emission is performed over a one-frame period, high efficiency is realized. The difference is clear in comparison with a passive matrix driving method in which diode electrodes of an OLED are directly coupled to a scanning line and a data line respectively and driven without providing any TFT.

In the passive matrix driving method, because the current flows into the OLED only while the scanning line is being selected. Accordingly, to obtain the same luminance as the light emission of a one-frame period from only the light emission of the short period, the emitting luminance multiplied by almost the number of lines is required in comparison with the active matrix driving. To attain the purpose, the driving voltage and the driving current must inevitably be increased. However, a power consumption loss, such as generation of heat, is increased and the power efficiency is decreased.

Thus, the active matrix driving method is assumed to be more superior to the passive matrix driving method from the standpoint of a reduction in power consumption.

SUMMARY OF THE INVENTION

In an active matrix driving method of an OLED, when the current is supplied to a capacitor for holding a display over a one-frame period, the one-handed electrode of the capacitor is connected to an output terminal of a switching transistor and the other-handed electrode is connected to a common potential line for the capacitor or a current supply line through which the current is supplied to the OLED.

FIG. 12 is a block diagram for typically describing one configuration example of a conventional display module that uses an OLED, and FIG. 13 is an explanatory drawing of the pixel configuration in FIG. 12. This display module (image display module) is constituted by arranging a data driving circuit DDR, a scanning driving circuit GDR, and a current supply circuit CSS around a display unit AR (inside enclosed by a dotted line in the drawing) formed on a substrate SUB composed of an insulating material, such as glass, in a matrix array of multiple data lines DLs and multiple gate lines, that is, scanning lines GLs.

The data driving circuit DDR has a complementary circuit consisting of N-channel and P-channel type TFTs or a shift register circuit, a level shifter circuit, and an analog switch circuit composed of a single channel type thin film transistor of only an N channel or a P channel. Besides, the current supply circuit CSS uses only a bus line, and can also be constituted so that the current will be supplied from an external power supply.

FIG. 12 shows a system by which a common potential line COML for a capacitor is provided in the display unit AR, and the other-handed electrode of the capacitor is connected to this common potential line COML. The common potential line COML is drawn out from a terminal COMT of a common potential supply bus line COMB to an external common potential source.

As shown in FIG. 13, a pixel PX has a first thin film transistor TFT1 that is a switching transistor arranged in the area enclosed by a data line DL and a gate line GL, a second thin film transistor TFT2 that is a driver transistor, a capacitor CPR, and an organic light emitting diode OLED. The gate of the thin film transistor TFT1 is connected to the gate line GL and the drain is connected to the data line DL. The gate of the thin film transistor TFT2 is connected to the source of the thin film transistor TFT1 and the one-handed electrode (positive electrode) is connected to this connection point.

The drain of the thin film transistor TFT2 is connected to a current supply line CSL and the source is connected to an anode AD of the organic light emitting diode OLED. The other-handed end (negative electrode) of the capacitor CPR is connected to the common supply line COML (FIG. 12). The data line DL is driven by the data driving circuit DDR and the scanning line (gate line) GL is driven by the scanning driving circuit GDR. Further, the current supply line CSL is connected to the current supply circuit CSS of FIG. 1 via a current supply bus line (not shown).

In FIG. 13, when a pixel PX is selected by the scanning line GL and the thin film transistor TFT1 is turned on, an image signal supplied from the data line DL is stored in the CPR. Further, when the thin film transistor TFT1 is turned on, the thin film transistor TFt2 is turned on, current from the current supply line CSL flows into the OLED, and this current continues over almost a one-frame period (or a one-field period, and so forth). The current that flows on this occasion is specified according to a signal charge stored in the capacitor CPR. The operation level of the capacitor CPR is specified according to the potential of the common potential line COML. Accordingly, the light emission of the pixel is controlled.

Because this system needs to provide the common potential line COML by piercing through part of a pixel region, what is called an aperture ratio is decreased and the improvement of brightness as a whole display module will be suppressed. Further, the number of production processes for providing the common potential line COML is increased.

FIG. 14 is the same block diagram for typically describing another configuration example of a conventional display module that uses an OLED. In this example, the basic placement of the thin film transistors TFT1, TFT2 and the capacitor CPR that constitute each pixel is the same displacement as FIG. 13, but differs in that the other end of the capacitor CPR is connected to the current supply line CSL.

That is, when a pixel PX is selected by the scanning line GL and the thin film transistor TFT1 is turned on, an image signal supplied from the data line DL is stored in the capacitor CPR. If the thin film transistor TFT2 is turned on when the thin film transistor TFT1 is turned off, the current from the current supply line CSL flows into the OLED. This current continues over almost a one-frame period in the same manner as FIG. 13. The current that flows on this occasion is specified a signal charge stored in the capacitor CPR. The operation level of the capacitor CPR is specified according to the potential of the current supply line CSL. Accordingly, the light emission of a pixel is controlled.

In this type of the display module described in FIGS. 12 to 14, the source electrode of the thin film transistor TFT2 that forms a first electrode layer (for example, anode) AD of the organic light emitting diode OLED is formed using a conductive thin film, such as ITO (indium tin oxide), and the first electrode layer AD of each pixel PX is isolated individually. Accordingly, an electric field is concentrated on an edge of the first electrode layer AD and the leakage current may be generated between the edge and a second electrode layer (for example, cathode) CD.

FIG. 15 is a sectional view for describing the structure near a pixel of a display module that uses an organic light emitting diode. This display module is constituted by piling up a polycrystalline silicon semiconductor layer PSI that uses low temperature polycrystalline silicon as an ideal material, a first insulation layer IS1, a gate line (gate electrode) GL that is a scanning line, a second insulation layer IS2, a source electrode SD formed using an aluminum wire, a third insulation layer IS3, a passivation film PSV, a first electrode layer AD, an organic light emitting layer OLE, and a second electrode layer CD on a glass substrate SUB.

When a thin film transistor (this thin film transistor is a driver transistor) composed of the polycrystalline silicon semiconductor layer PSI, the gate line GL, and the source electrode SD is selected, an organic light emitting diode formed using the first electrode layer AD connected to the source electrode SD, the organic light emitting layer OLE, and the second electrode layer CD emits light and the light L is incident on the outside from the substrate SUB.

In the configuration part of this organic light emitting diode, the edge of the first electrode layer AD or the edge of the second electrode layer CD is close to the second electrode layer CD or the first electrode layer AD via the thin organic light emitting layer OLE. In such structure, the following problem is easy to occur.

FIG. 16 is an enlarged drawing of the part shown by the A of FIG. 15. As shown in the same drawing, an electric field is concentrated on the edge of the first electrode layer AD or the second electrode layer CD. Accordingly, the organic light emitting layer OLE is dielectrically broken down between the second electrode layer CD and the first electrode layer AD and leakage current X is easy to occur. When such leakage current X occurs, a high current flows from the current supply line CSL into a thin film transistor and will damage the thin film transistor. When the thin film transistor is damaged, what is called a point defect occurs and a display fault will be produced.

Further, because a scanning line, a data line or two thin film transistors, and a capacitor are formed on a substrate SUB in a multi-layered structure, even if the top of the second electrode layer coated with the organic light emitting layer is flat, the flatness of the periphery is extremely low. Therefore, dispersion occurs in the space between the first electrode layer and the second electrode layer, and the same leakage current as above occurs in the part where both electrode layers are adjacent each other.

An organic light emitting layer is coated using a method, such as printing coating, coating using ink jet, or spin coating. Because the coating material of the organic light emitting layer used in such coating has fluidity, if the flatness of a coating surface and its periphery is low, the coated organic emitting material flows into the periphery or is piled up in a part of the periphery. Accordingly, it is difficult to form the organic light emitting layer in uniform thickness and through a necessary and sufficient spread over the predetermined pixel region.

When an organic light emitting layer differs in its thickness and spread every pixel, a difference occurs in each emitting luminance and the brightness in all screen areas becomes uneven, thereby disabling acquisition of a high image quality display.

An object of the present invention is to provide a display module that enables a high quality display by preventing the leakage current generated between a first electrode layer and a second electrode layer that constitute a pixel via an organic light emitting layer and forming the organic light emitting layer that constitutes the pixel in uniform thickness and through a necessary and sufficient spread over the predetermined pixel region.

To attain the above object, the present invention prevents the generation of leakage current between a first electrode layer and a second electrode layer, as described above, by providing an interlayer insulation layer between an edge of the first electrode layer and an organic light emitting layer that constitute a pixel and sufficiently securing the distance between the edge and the second electrode layer.

Further, the present invention improves flatness as a whole by using a resin material with fluidity in the interlayer insulation layer, forming an organic light emitting layer accommodation unit on this interlayer insulation layer, and forming the coated organic light emitting layer in uniform thickness and through a necessary and sufficient spread over the predetermined pixel region.

By using this configuration, the leakage current that is generated between a first electrode layer and a second electrode layer that constitute a pixel via an organic light emitting layer is prevented. Further, because the organic light emitting layer that constitutes the pixel is formed in uniform thickness and through a necessary and sufficient spread over the predetermined pixel region, a display module that enables a high quality display can be obtained. A more specific configuration example of the present invention is described below. That is, (1) A display module is provided with multiple scanning lines arranged in a matrix on a substrate, multiple data lines that intersect the multiple scanning lines, and a current supply line that supplies display current to a pixel and has a pixel every intersection unit of each of the scanning lines and each of the data lines, wherein the pixel has an active element selected by the scanning line, a data holding element that holds a data signal supplied from the data line by the turn-on of this active element, and an emitting device that emits light by the current supplied from the current supply line in accordance with the data signal held by the data holding element, the emitting device has a first electrode layer driven by the active element, an organic light emitting layer applied on the first electrode layer, and a second electrode layer formed on the organic light emitting layer, and an interlayer insulation layer is provided between the first electrode layer and the second electrode layer in the periphery of a light emission unit formed in the lamination structure of the first electrode layer, the organic light emitting layer, and the second electrode layer.

(2) In (1), the interlayer insulation layer provides an aperture in which the organic light emitting layer is accommodated in the coating region of the organic light emitting layer that constitutes the light emission unit.

(3) In (2), the interlayer insulation layer is formed by being coated with a fluidity resin.

(4) In (3), an acrylic resin is used as the fluidity resin.

(5) In any one of (1) to (4), the display module has at least either an insulation layer or a passivation film between at least a part of the first electrode layer and the substrate, and an aperture in which the organic light emitting layer is accommodated in at least either the insulation layer or the passivation film.

(6) In any one of (1) to (5), the interlayer insulation layer is formed by covering an edge of the first electrode layer.

(7) In (6), the interlayer insulation layer is formed by covering all edges of the first electrode layer.

By using the above configuration of (1) to (7), the distance between the edge of the first electrode layer and the edge of the second electrode layer is secured sufficiently and the generation of leakage current between the first electrode layer and the second electrode layer is prevented via an organic light emitting layer.

(8) A display module is provided with multiple scanning lines arranged in a matrix on a substrate, multiple data lines that intersect the multiple scanning lines, and a current supply line that supplies display current to the pixel and has a pixel every intersection unit of each of the scanning lines and each of the data lines, wherein the pixel has an active element selected by the scanning line, a data holding element that holds a data signal supplied from the data line by the turn-on of this active element, and an emitting device that emits light by the current supplied from the current supply line in accordance with the data signal held by the data holding element, the emitting device has a first electrode layer driven by the active element, an organic light emitting layer applied on the first electrode layer, and a second electrode layer formed on the organic light emitting layer, and an interlayer insulation layer formed by coating a fluidity resin is provided between the first electrode layer and the second electrode layer in the periphery of a light emission unit formed in the lamination structure of the first electrode layer, the organic light emitting layer, and the second electrode layer.

(9) In (8), an acrylic resin is used as the fluidity resin.

(10) In (8) or (9), the interlayer insulation layer is formed by covering an edge of the first electrode layer.

(11) The interlayer insulation layer is formed by covering all edges of the first electrode layer.

(12) In any one of (8) to (1), the first electrode layer is formed using ITO.

By using the above configuration of (8) to (12), because an organic light emitting layer that constitutes a pixel is formed in uniform thickness and through a necessary and sufficient spread over the predetermined pixel region in addition to the effect according to the above configuration of (1) to (7), a display module that enables a high quality display can be obtained.

Besides, the present invention is not limited to the above configuration and the configuration of the embodiments described later, and, needless to say, enables various modifications without deviating from a technical idea of the present invention.

BRIEF DESCRIPTION OF THE DRAWINGS

Preferred embodiments of the present invention will be described in detail based on the followings, wherein.

DESCRIPTION OF PREFERRED EMBODIMENTS

Embodiments of the present invention are described in detail below with reference to the drawings of the embodiments.

An organic light emitting layer provided in each pixel that is not shown, but is described later performs a monochromatic or color display by emitting light in the luminance that is proportional to a current value and a color (including white) that depends on the organic materials and performs the color display that emits by combining a color filter, such as red, green, or blue with an organic layer that emits white light.

Figure 1:
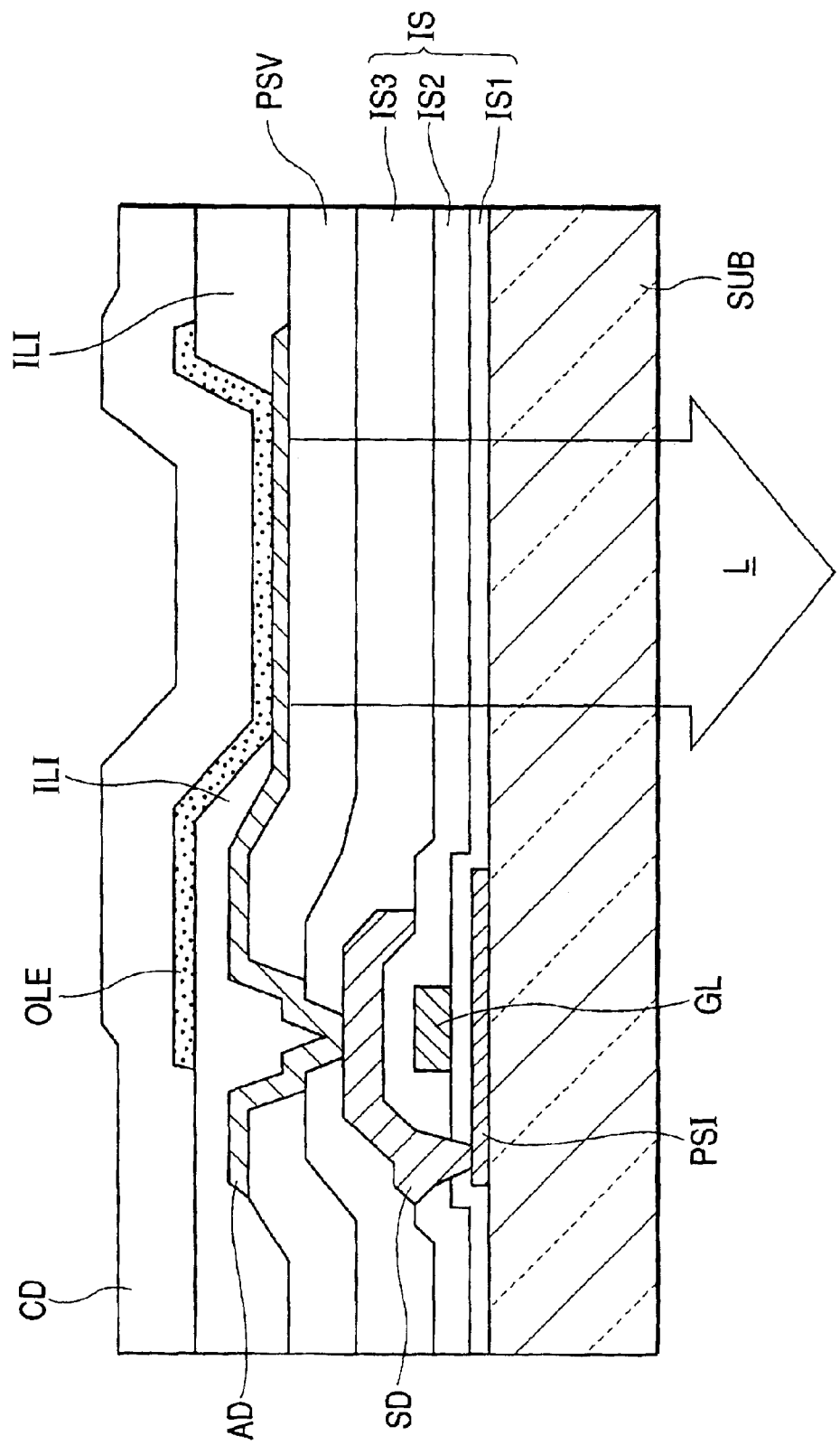
FIG. 1 is a typical sectional view near a pixel for describing the configuration of a first embodiment of a display module according to the present invention.

FIG. 1 is a typical sectional view near a pixel for describing the configuration of a first example of a display module according to the present invention. The display module that uses an active matrix type organic light emitting diode (OLED) shown in FIG. 1 has a thin film transistor of each element formed on an insulating substrate SUB, such as glass, using a polycrystalline silicon layer PSI.

The thin film transistor of this embodiment has a first insulation layer IS1, a gate line (scanning line) GL, a second insulation layer IS2, a source line SD, and a third insulation layer IS3 on the polycrystalline silicon layer PSI, and an ITO pattern that becomes a first electrode layer is formed on a passivation film PSV formed on the upper layer unit of the third insulation layer IS3. This first electrode layer AD is connected to the source line SD through a contact hole perforated by piercing into the passivation film PSV and the third layer IS3.

Subsequently, before an organic light emitting layer OLE is coated on the passivation film OSV, an interlayer insulation layer ILI with fluidity composed of an acrylic resin is coated and the smoothness of the surface is improved. At the same time, an aperture is formed in the pixel region of the interlayer insulation layer ILI by a processing means, such as a photolithographic technique. This aperture is formed only in the area required for providing an organic light emitting layer inside the pattern of the first electrode layer AD.

Accordingly, a recessed part in which the interlayer insulation layer ILI becomes an inside wall having a taper and a flat first electrode layer AD is exposed at the bottom is formed in the pixel region. By coating this recessed part with an organic light emitting layer OLE, a uniform organic light emitting layer OLE in necessary thickness is accommodated and formed in the pixel region. Further, the organic light emitting layer OLE coated around the pixel region is isolated from the first electrode layer AD in the interlayer insulation layer ILI.

After the organic light emitting layer is coated, the upper layer is covered and a second electrode layer CD is formed. A metal film is suitable for this second electrode layer CD. Because the interlayer insulation layer ILI has a taper, what is called step disconnection is difficult to occur in the organic light emitting layer OLE and the second electrode layer CD applied on it. The second electrode layer CD formed at an edge around the organic light emitting layer OLE is isolated from the first electrode layer AD including the edge. Accordingly, the generation of leakage current between the edge of either the first electrode layer AD or the second electrode layer CD or between the edge of both electrode layers is prevented sufficiently.

Thus, according to this embodiment, the distance between an edge of a first electrode layer and a second electrode layer that constitute a pixel is secured sufficiently and the generation of leakage current between the first electrode and the second electrode layer via an organic light emitting layer is prevented. Further, because the organic light emitting layer that constitutes the pixel is formed in uniform thickness and through a necessary and sufficient spread over the predetermined pixel region a display module that enables a high quality display is obtained.

Figure 2:
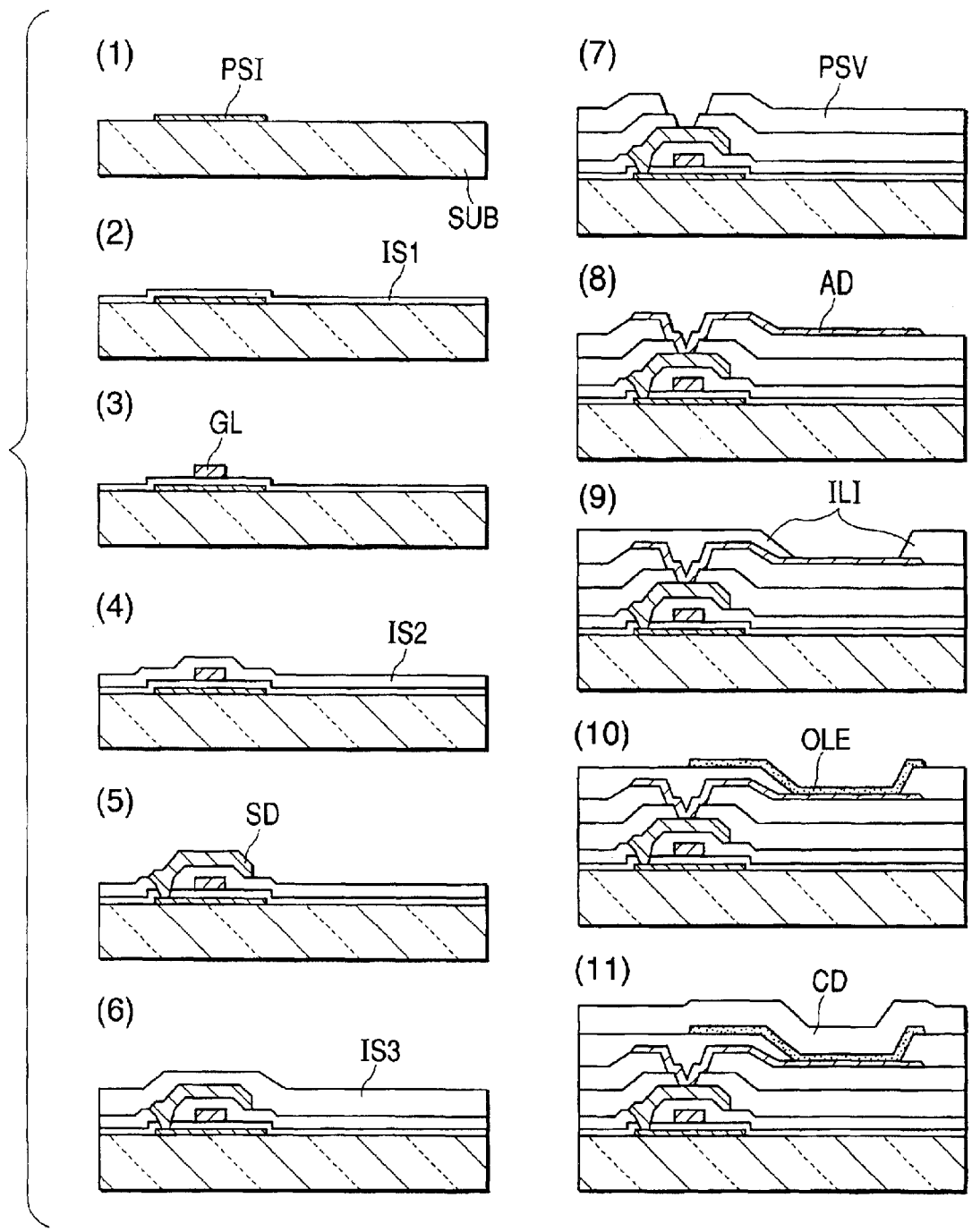
FIG. 2 is a typical drawing for describing a cross section near a pixel in the order of a production process in which an example of the production process of the display module of the first embodiment is described in the display module according to the present invention.

FIG. 2 is a typical drawing for describing a cross section near a pixel in the order of a production process in which an example of the production process of the display module of the first embodiment is described in the display module according to the present invention. This embodiment uses a thin film transistor of what is called the top gate structure, but also uses a thin film transistor of what is called the bottom gate structure in the same manner. This process is described below in the order of steps (1) to (11).

(1) A polycrystalline silicon semiconductor layer PSI is patterned on a glass substrate SUB and laser annealing for crystallization is applied.

(2) A first insulation layer IS1 is formed on it.

(3) A gate line (scanning line) GL is formed by depositing and patterning a conductive thin film, such as titanium (Ti) or tungsten (W).

(4) A second insulation layer IS2 is formed and a contact hole is perforated at a necessary place.

(5) An aluminum wire that becomes a source electrode SD is formed (as the need arises, the top and bottom of an aluminum thin film are sandwiched between materials of titanium (Ti) or tungsten (W).

(6) A third insulation layer IS3 is formed by covering an aluminum wire.

(7) Further, a passivation film PSV is formed using p-Sin. A contact hole that pierces into this passivation film PSV and the third insulation layer IS3 and reaches the source electrode SD is perforated.

(8) A first electrode AD is formed by depositing ITO. This first electrode layer AD is connected to the source electrode SD via the contact hole.

(9) An interlayer insulation layer ILI for insulating an organic light emitting layer from an edge of the first electrode layer AD is formed. Further, an aperture is perforated in the pixel region required for light emission and at a place necessary for external connection in the interlayer insulation layer ILI. The interlayer insulation layer ILI uses an acrylic resin with fluidity. A taper is formed on an inside wall by applying heat when the aperture pattern of the pixel region is formed.

(10) The aperture of the pixel region is coated with an organic light emitting layer OLE. The coating of the organic light emitting layer OLE is performed by a method, such as mask printing or ink jet.

(11) A metal layer is formed by covering an organic light emitting layer OLE and a second electrode layer CD.

After the above process, a display module is completed by being sealed in a sealing can or with a proper member, such as glass and ceramics, and being put into a module.

Figure 3:
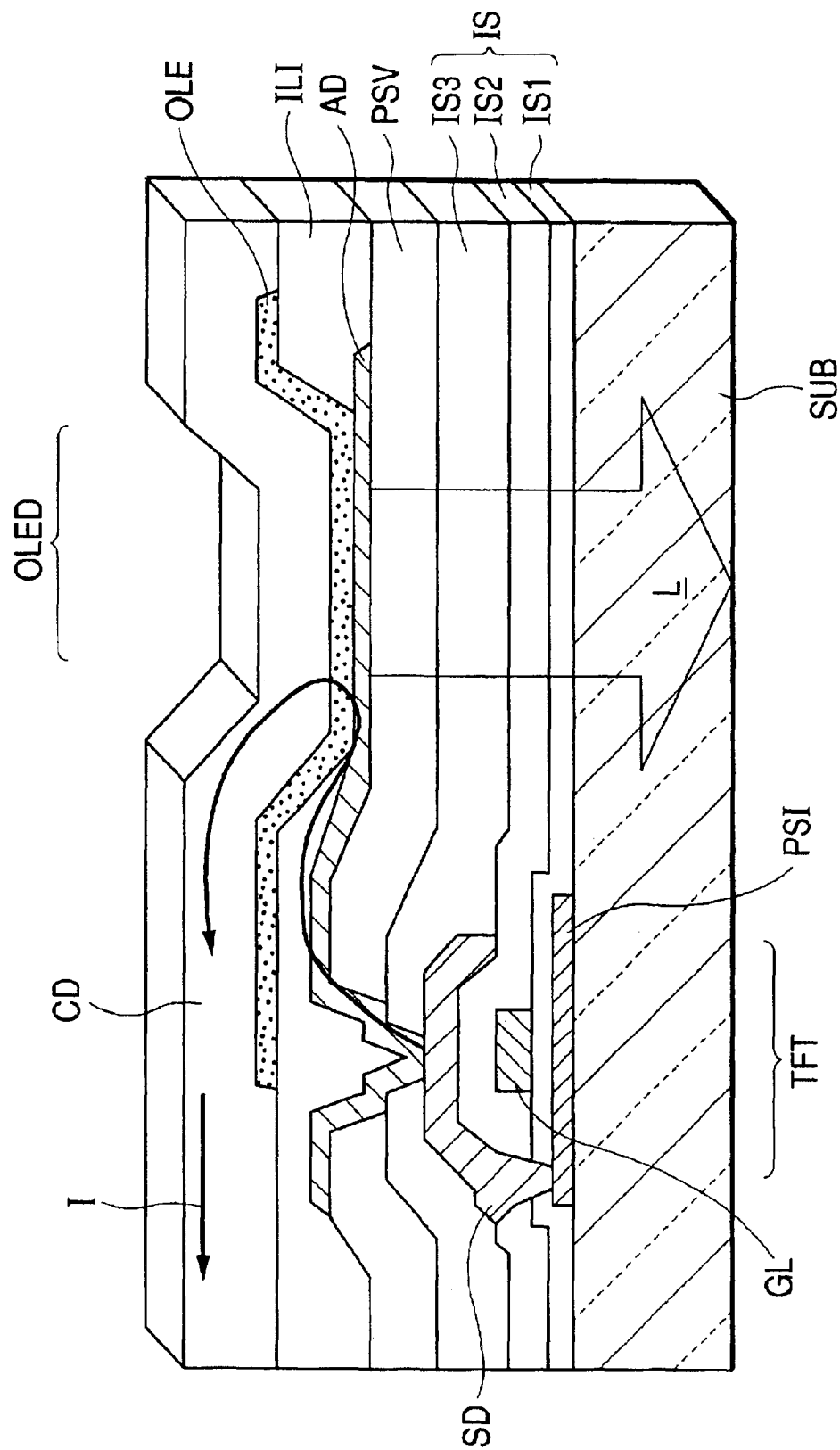
FIG. 3 is a typical drawing in the vicinity of a pixel for describing a light emission mechanism of the display module according to the present invention.

FIG. 3 is a typical drawing in the vicinity of a pixel for describing a light emission mechanism of the display module according to the present invention. The same reference symbol as FIG. 1 corresponds to the same part. Further, the arrow mark using the reference symbol I of the drawing shows a path of the current that yields to light emission.

Figure 14:
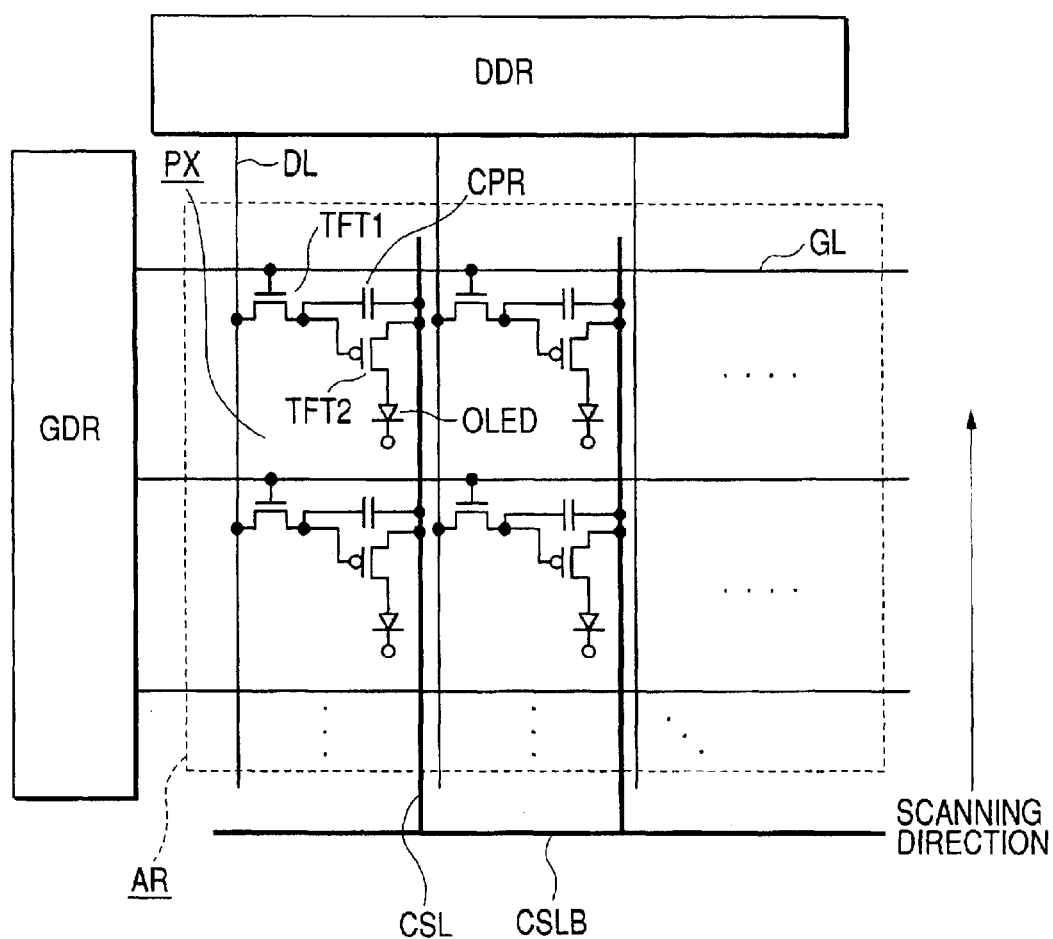
FIG. 14 is the same block diagram as FIG. 13 for typically describing another configuration example of the conventional display module that uses the organic emitting device.
Figure 15:
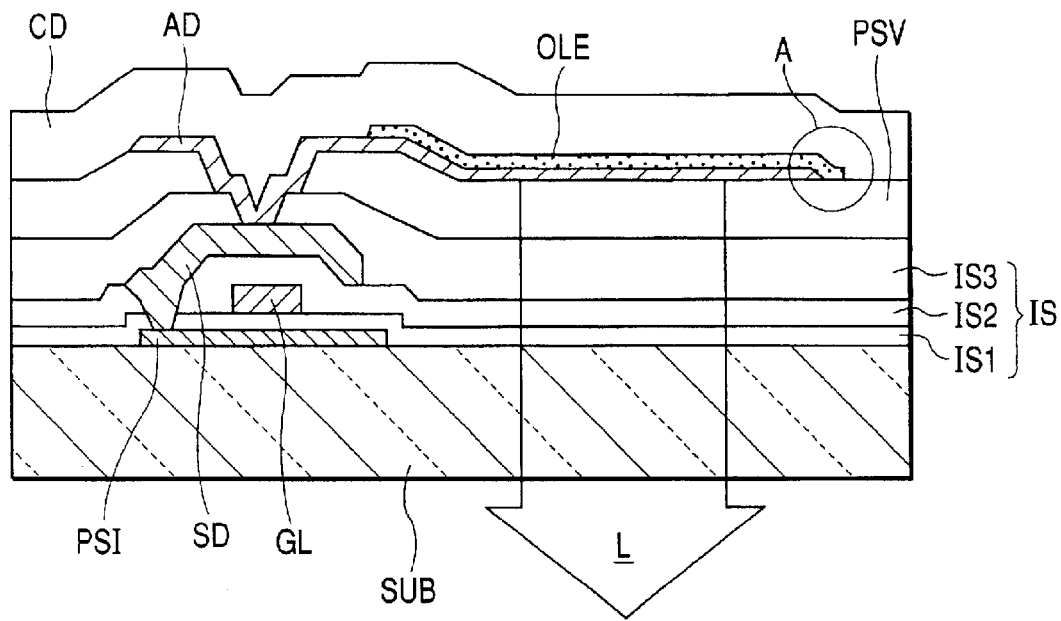
FIG. 15 is a sectional view for describing the structure in the vicinity of a pixel of a display module that uses the organic emitting device.
Figure 16:
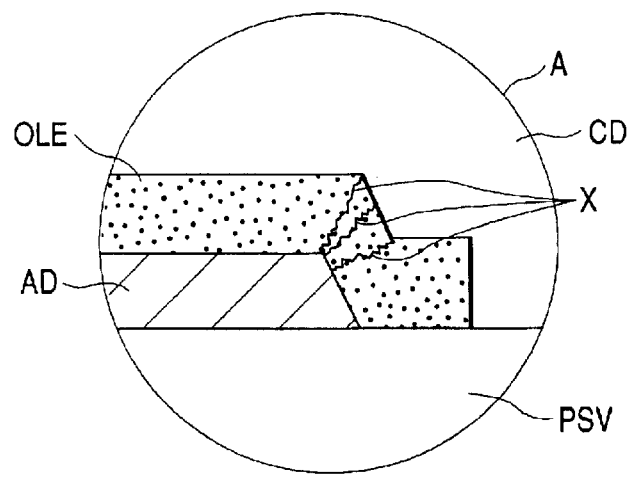
FIG. 16 is an enlarged drawing of the part showing by A of FIG. 15.

A thin film transistor TFT is a driver transistor. When this thin film transistor TFT is selected by a gate line GL, the current I having a current value of a gray scale that matches a data signal held in a capacitor is supplied to a first electrode layer AD of an organic light emitting diode OLED through the thin film transistor TFT (see FIG. 14).

In an organic light emitting diode OLED, an electron from a second electrode layer CD and a hole from a first electrode layer AD are recombined in the organic light emitting layer OLE and light L of a spectrum that matches material characteristics of the organic light emitting layer OLE is emitted. The first electrode layer AD is independent every pixel and the second electrode layer is formed all over in a film shape concerning all pixels.

The current that passes through an organic emitting device OE from a thin film transistor TFT flows out via a current drain line that is not shown from a second electrode layer CD. A two-dimensional display module is constituted by arranging such many pixels in a matrix.

Figure 4:
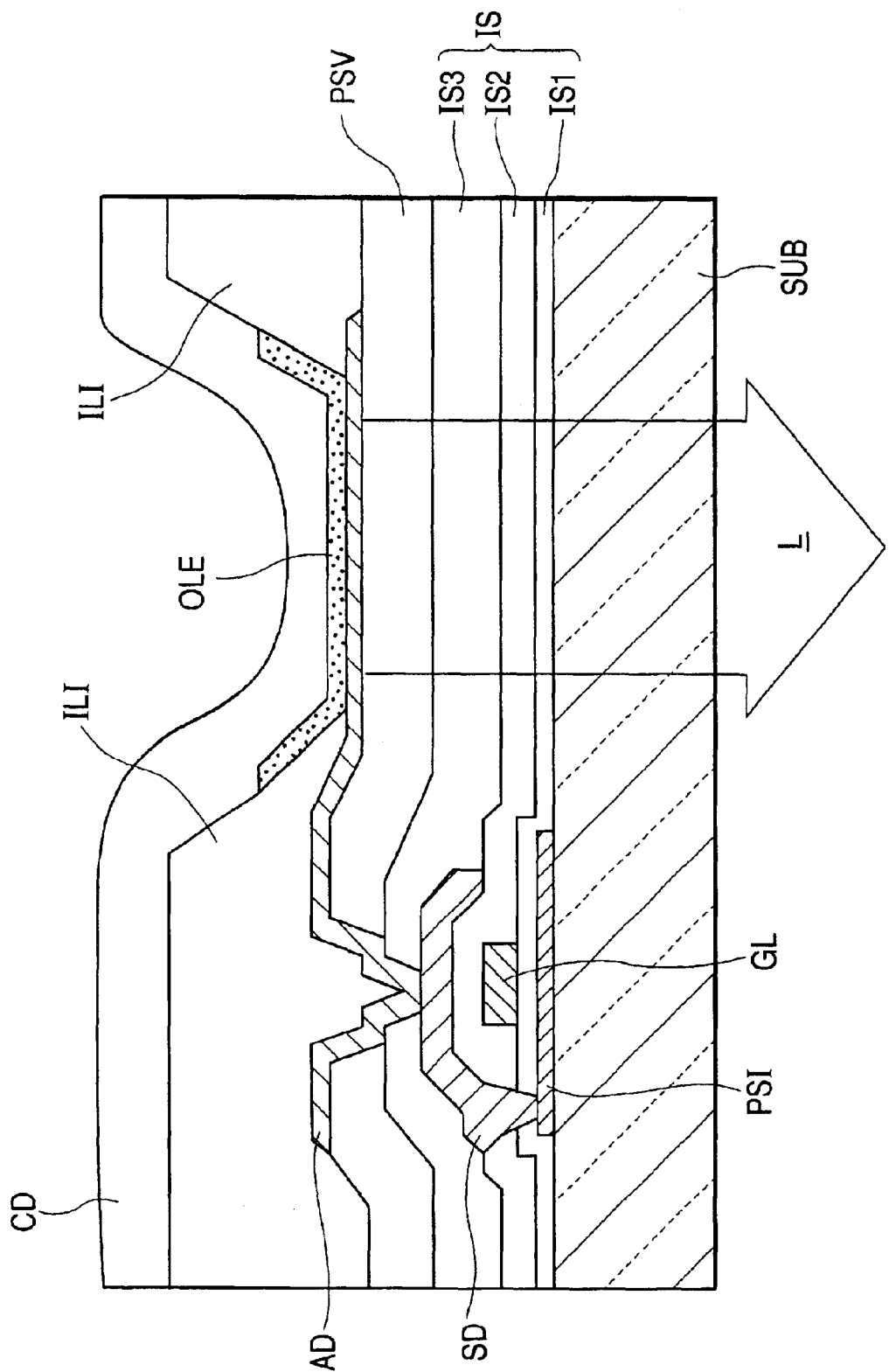
FIG. 4 is a typical sectional view in the vicinity a pixel for describing the configuration of a second embodiment of the display module according to the present invention.

FIG. 4 is a typical sectional view near a pixel for describing the configuration of the second example of the display module according to the present invention. The same reference symbol as FIG. 1 corresponds to the same function part. In this embodiment, the film thickness of the interlayer insulation layer ILI shown in FIG. 1 is about 1 μm, whereas the volume of an aperture (recessed part) in which an organic light emitting layer OLE is accommodated is increased by thickening the film thickness 2 or 3 μm, for example.

This embodiment has the structure suitable when an organic light emitting layer OLE is coated using an inkjet system. When the organic light emitting layer OLE is coated using the inkjet system, an organic emitting material splashes from an inkjet nozzle into the aperture of an interlayer insulation layer and reaches a first electrode layer AD with the material diluted in some solvent and with the volume increased.

On this occasion, because the volume of an aperture is increased (deepened), a color mixture of both apertures of adjacent pixels can be prevented. Moreover, the color mixture into the adjacent pixels can further be prevented effectively by smoothing the tapered angle of an inside wall that forms the aperture of an interlayer insulation layer.

That is, according to this embodiment, an organic light emitting layer applied to each pixel can be isolated clearly and deterioration in the saturation of a luminous color can be prevented in addition to the effect of the embodiment described above. Besides, mask printing and spin coating systems as well as an inkjet system can be applied to the coating of the organic light emitting layer OLE.

Figure 5:
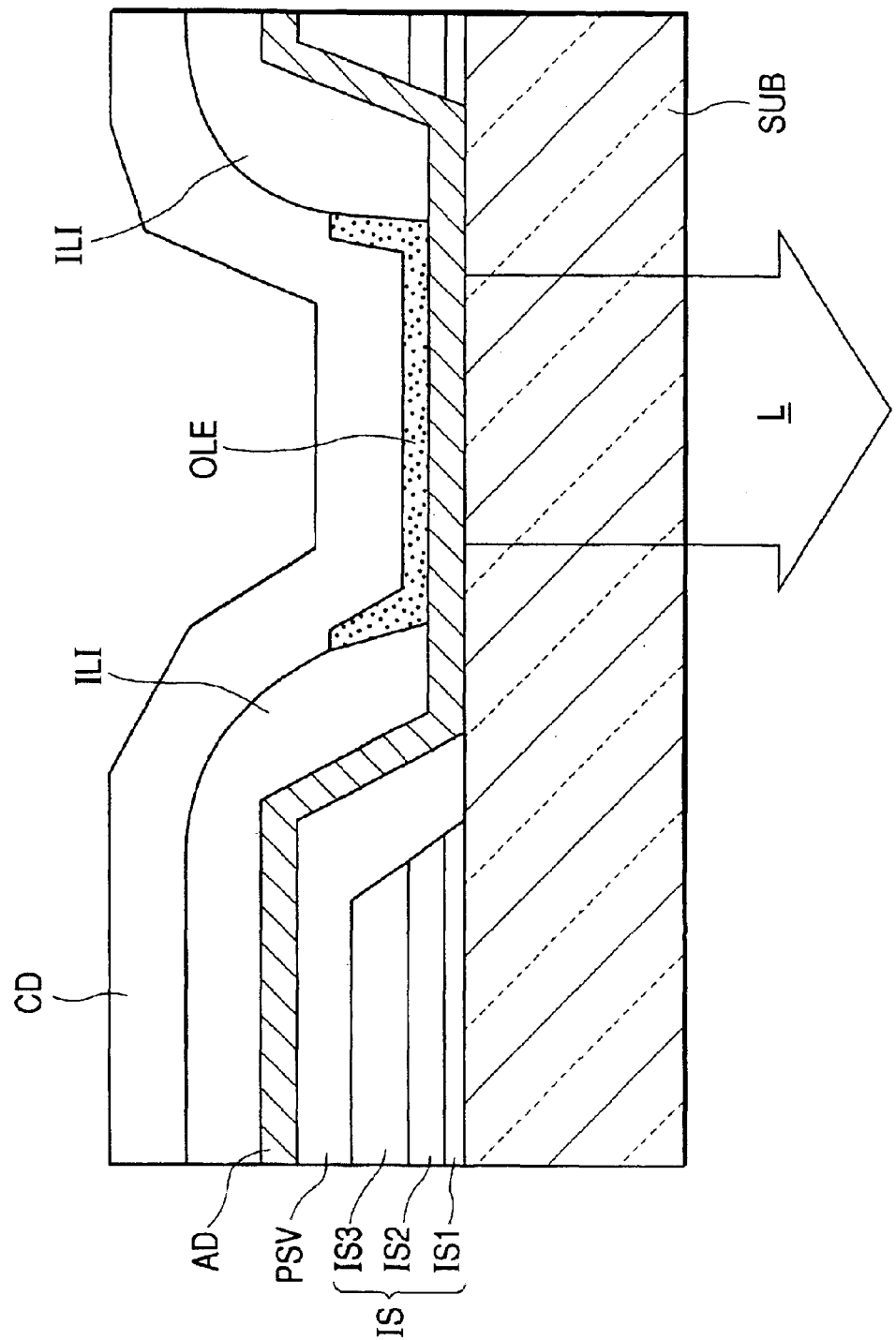
FIG. 5 is a typical sectional view in the vicinity a pixel for describing the configuration of a third embodiment of the display module according to the present invention.

FIG. 5 is a typical sectional view near a pixel for describing the configuration of a third example of the display module according to the present invention. The same reference symbol as FIG. 1 corresponds to the same function part. This embodiment further increases the volume of an aperture (recessed part) in which the insulation layer IS and the passivation film PSV are removed from the pixel region and an organic light emitting layer OLE is accommodated.

The interlayer insulation layer ILI is formed in the inside wall of the recessed part that is an aperture. The insulation layer of an organic light emitting layer OLE is formed on a first electrode AD and opens at the bottom of the recessed part. The organic light emitting layer OLE is accommodated in this aperture and the second electrode layer CD is formed on it.

This embodiment is also suitable when an organic light emitting layer OEL is coated using an inkjet system and, in addition to the effect of the example, an organic light emitting layer applied to each pixel can be isolated clearly and deterioration in the saturation of a luminous color can be prevented. Besides, mask printing and spin coating systems as well as the inkjet system can be applied to the coating of the organic light emitting layer OLE.

Figure 6:
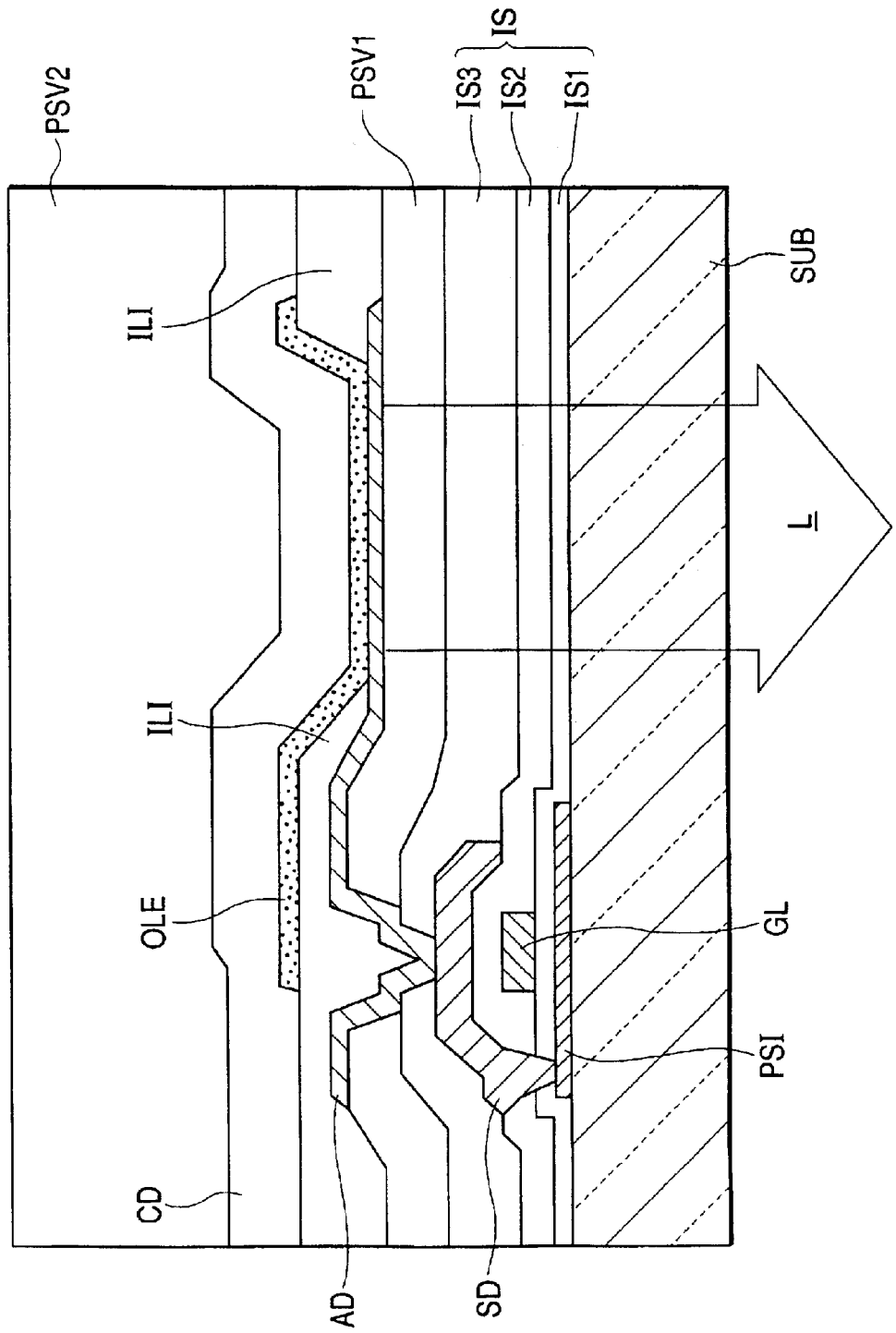
FIG. 6 is a typical sectional view in the vicinity a pixel for describing the configuration of a fourth embodiment of the display module according to the present invention.

FIG. 6 is a typical sectional view near a pixel for describing the configuration of a fourth embodiment of the display module according to the present invention. The same reference symbol as FIG. 1 corresponds to the same function part. In this embodiment, a second passivation film PSV2 is further formed on a passivation film PSV (equals to a first passivation film PSV1) in the first embodiment described in FIG. 1. Another configuration is the same configuration as FIG. 1.

In this embodiment, in addition to the effect of the first embodiment, because the top layer is further flatten and the intrusion of an external gas and moisture is prevented more accurately, the reliability of a display module can be improved further. Besides, the second passivation film PSV2 can also be formed toward the second or third embodiments in the same manner.

Figure 7:
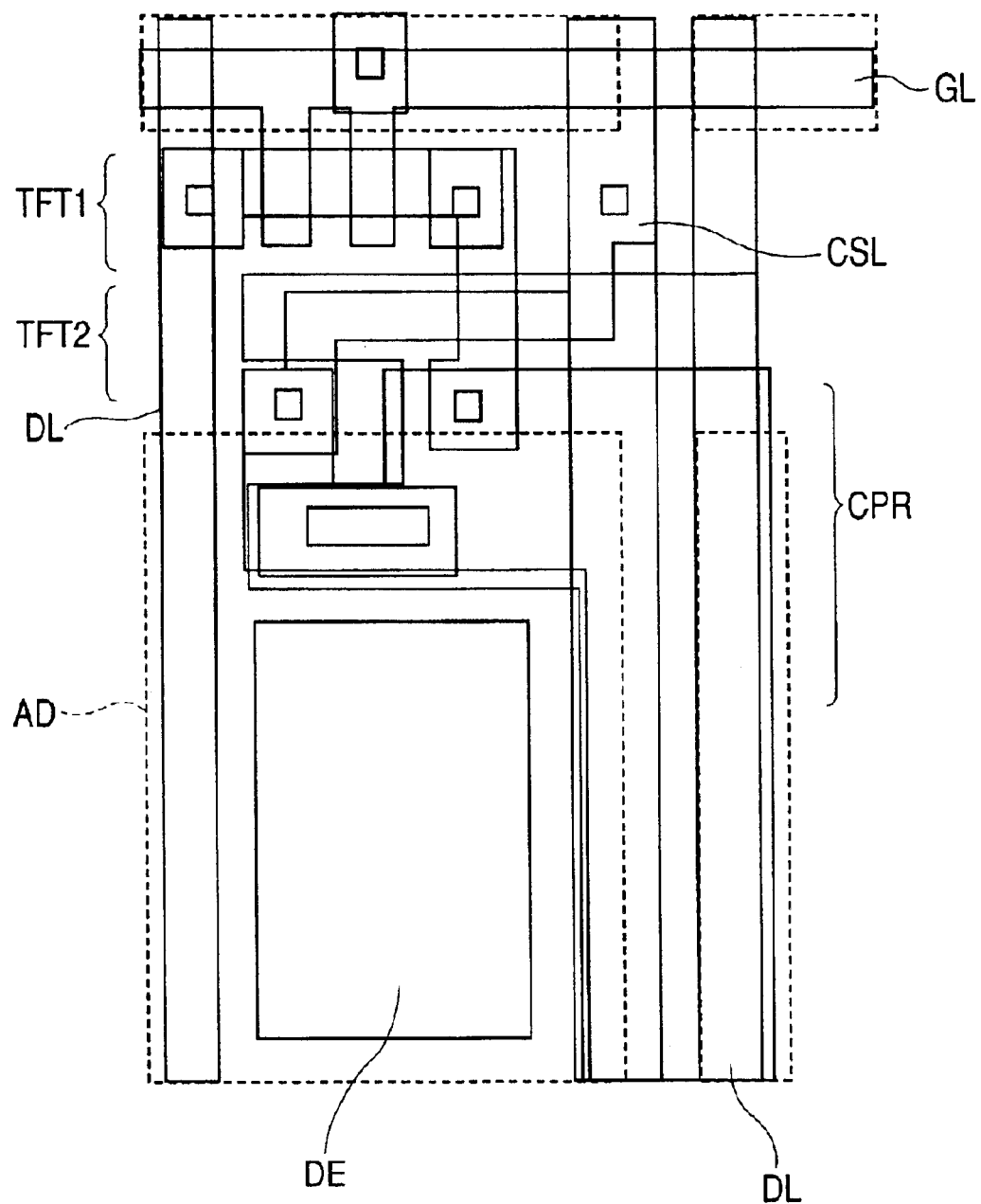
FIG. 7 is a top plan view near a pixel for describing an example of the circuit configuration of the display module according to the present invention.

FIG. 7 is a top plain view near a pixel for describing an example of the circuit configuration of the display module according to the present invention. A pixel is formed in the area enclosed by a scanning line (gate line) GL and a data line DL. Besides, the reference symbol AD is a first electrode layer (anode here) and CSL is a current supply line.

A pixel circuit has a first thin film transistor TFT1 (switching transistor), a second thin film transistor TFT2 (driver transistor), and a capacitor CPR. Further, an aperture DE that accommodates an organic light emitting layer is provided in the part where the pixel circuit and each wiring are prevented.

Figure 8:
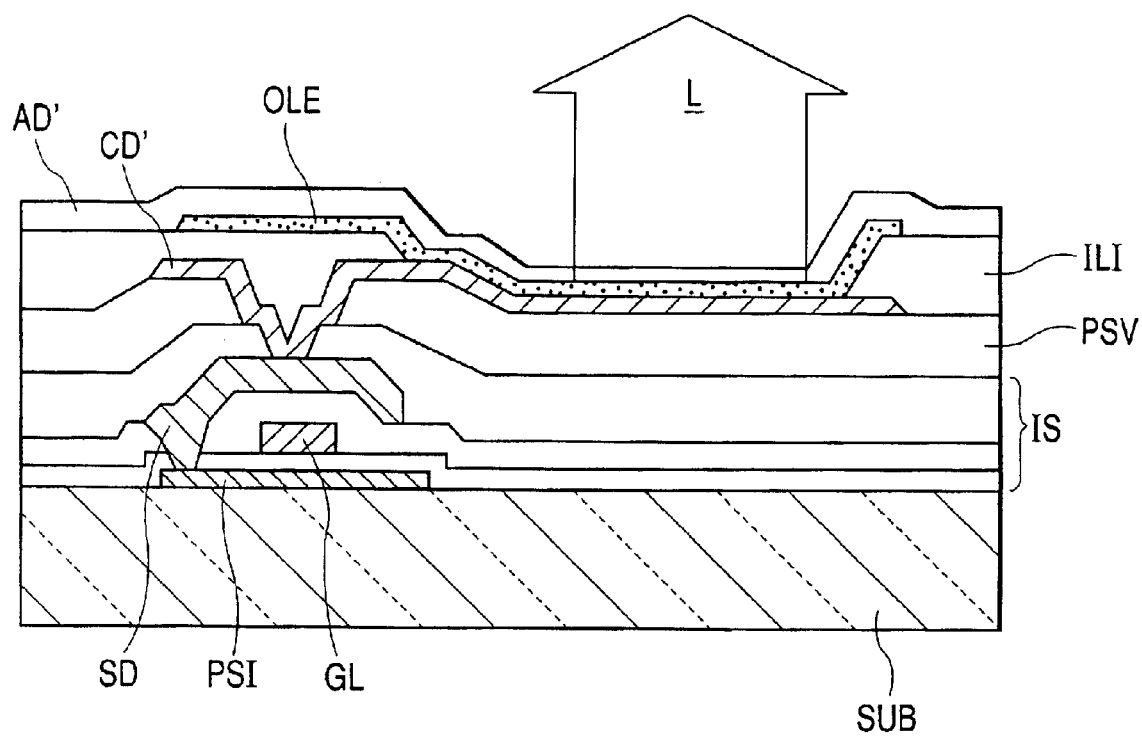
FIG. 8 is a typical sectional view in the vicinity a pixel for describing the configuration of a fifth embodiment of the display module according to the present invention.

FIG. 8 is a typical sectional view for describing the configuration of a fifth embodiment of the circuit configuration of the display module according to the present invention. The same reference symbol as FIG. 1 corresponds to the same function part. This embodiment has the configuration in which the exit direction of light emission is set at the opposite side with a substrate. In the drawing, CD' indicates a first electrode layer (cathode here) formed using a metal thin film and AD' indicates a second electrode (anode here) formed using a transparent conductive film, such as ITO.

In this embodiment, the emission light in an organic light emitting layer OLE exits from the second electrode layer AD'. Accordingly, a sealing member that is not shown, but is provided on the side of the second electrode layer AD' uses a transparent member, such as glass.

Figure 9:
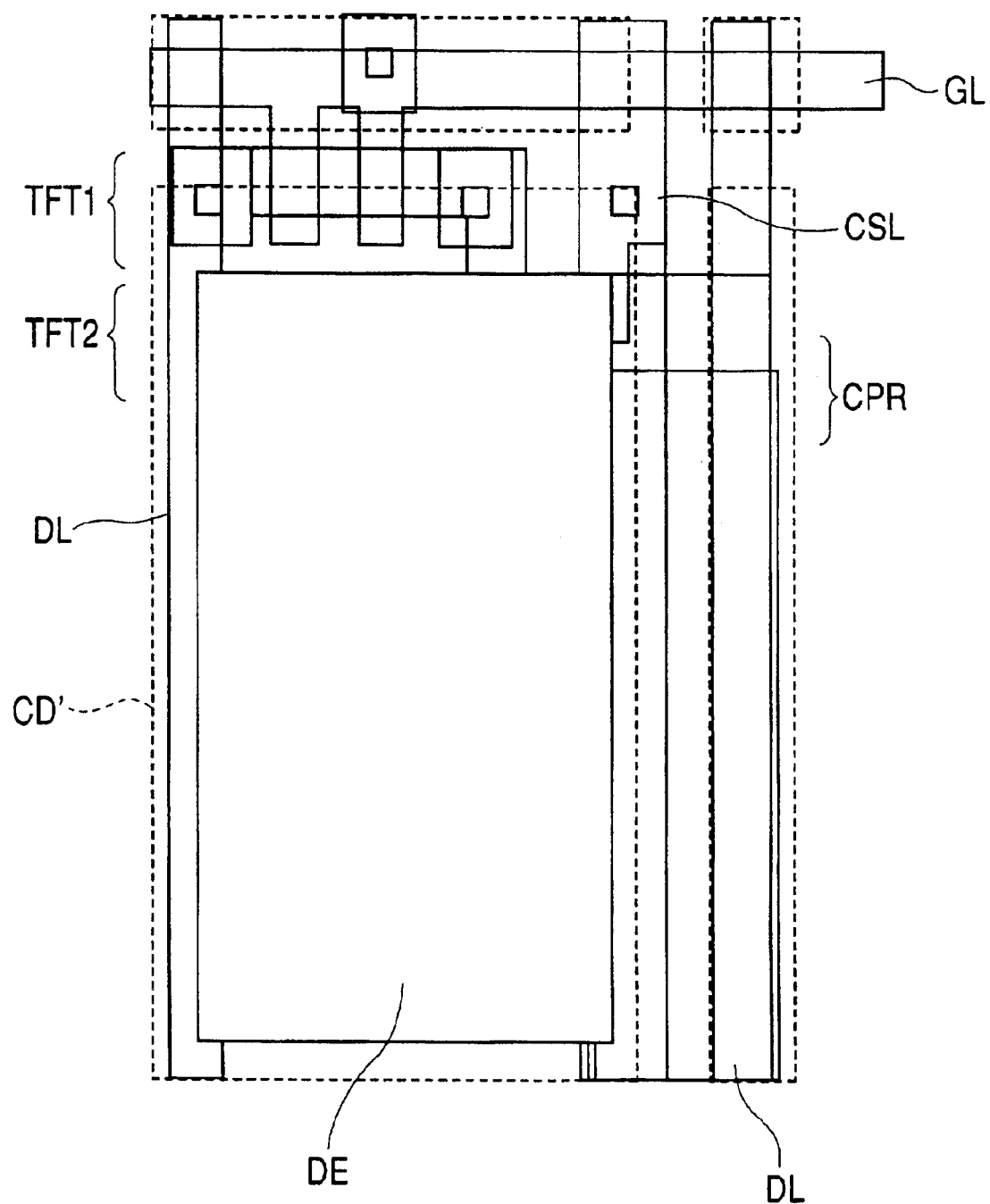
FIG. 9 is a top plan view near a pixel for describing an example of the circuit configuration of the display module according to the present invention shown in FIG. 8.

FIG. 9 is a top plan drawing near a pixel for describing an example of the circuit configuration of the display module according to the present invention shown in FIG. 8. The same reference symbol as FIG. 7 corresponds to the same function part. A pixel is formed in the area enclosed by a scanning line (gate line) GL and a data line DL in the same manner as the above embodiment.

In this embodiment, an aperture DE that accommodates an organic light emitting layer OLE needs not to be provided in the part where the pixel circuit and each wiring are prevented. Accordingly, because the configuration of this embodiment is obtained, there is an advantage that a pixel having a high aperture ratio and a wide area can be formed. On the whole, a display module having a bright screen, and a display module having low consumption power and a long life span can be obtained.

Figure 10:
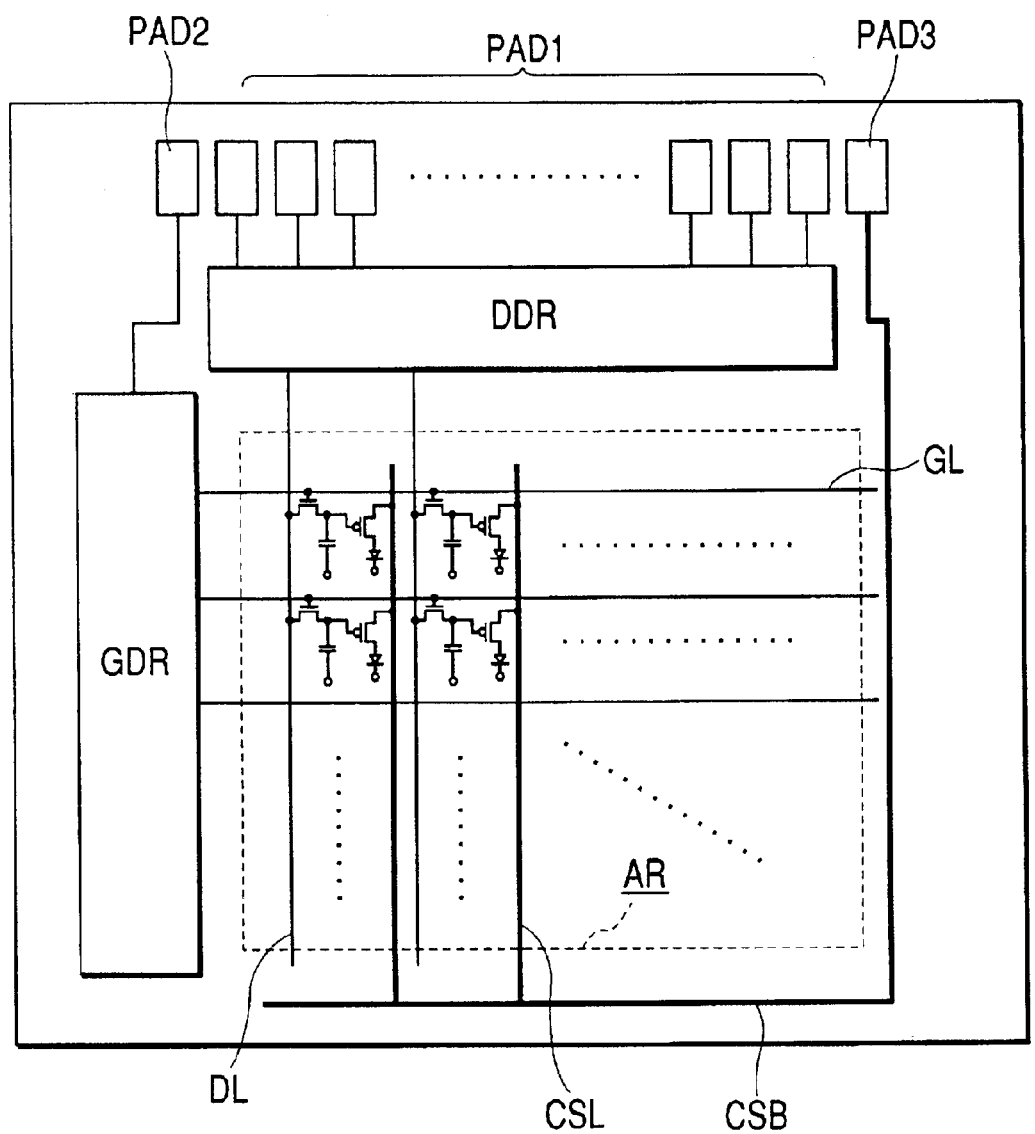
FIG. 10 is a top plan view for typically describing an example of the circuit placement of the display module according to the present invention.
Figure 11:
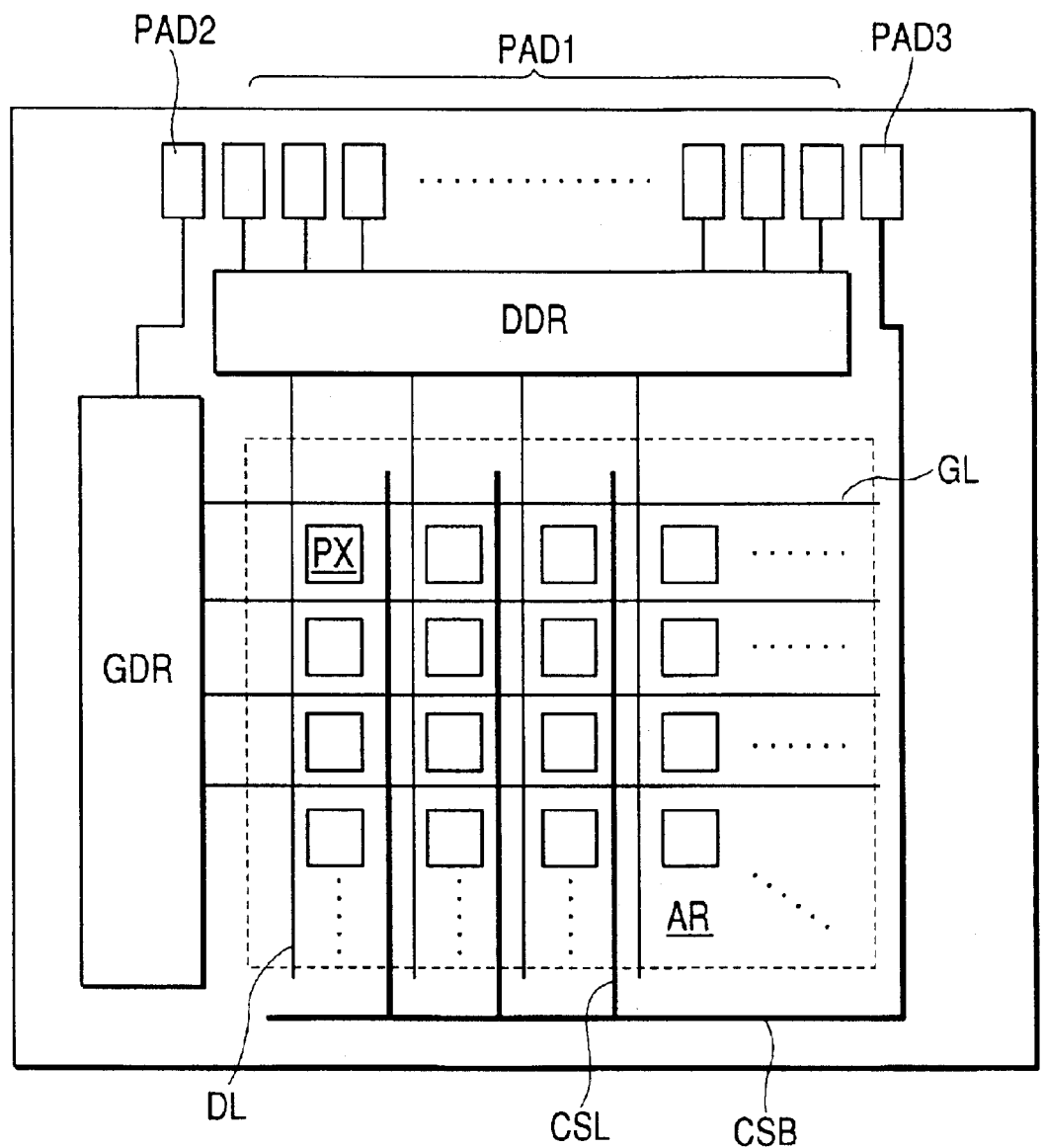
FIG. 11 is a top plan view for typically describing an example of the aperture position of a pixel provided corresponding to the circuit placement of FIG. 10.
Figure 12:
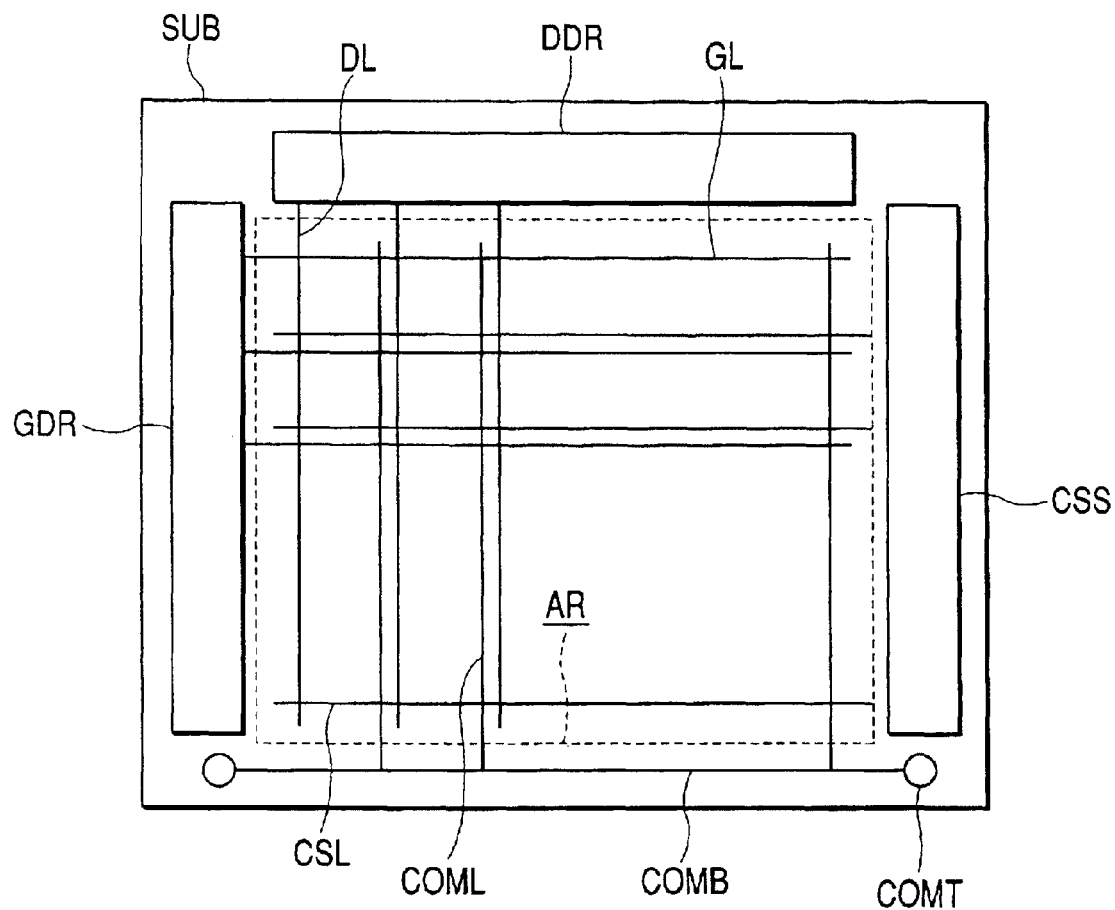
FIG. 12 is a block diagram for typically describing a configuration example of a conventional display module using an organic emitting device.
Figure 13:
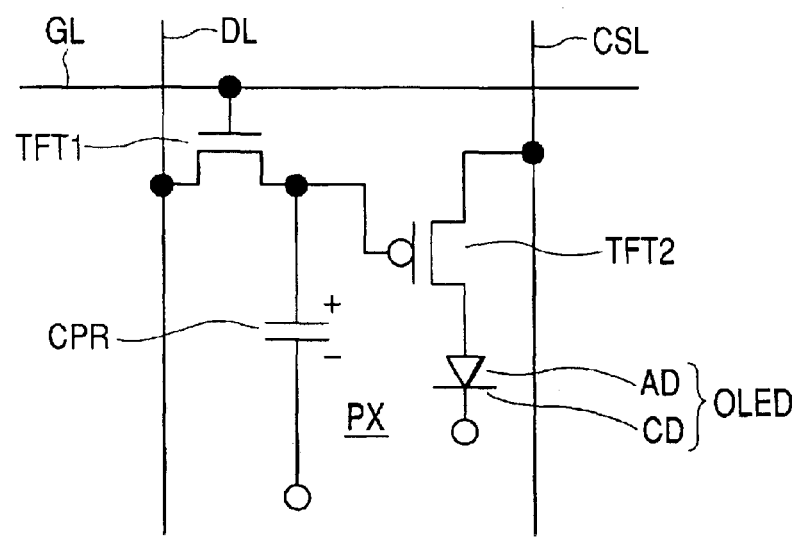
FIG. 13 is an explanatory drawing of the pixel configuration in FIG. 12.

FIG. 10 is a top plan drawing for typically describing an example of the circuit placement of the display module according to the present invention, and FIG. 11 is a top plan view for typically describing an example of the aperture position of a pixel provided corresponding to the circuit placement of FIG. 10. Each pixel is formed in the part enclosed by a scanning line GL driven in a scanning driving circuit GDR and a data line DL driven in a data driving circuit DDR and arranged in a matrix shape. A current supply line CSL branches at the outside of a display region AR from a current supply bus line CSB and arranged in parallel to the data line DL for each pixel.

Besides, PAD is a pad for externally supplying a signal and power to a display module via a flexible printed board. PAD1 indicates a pad for a data driver, PAD2 indicates a pad for a scanning driver, and PAD3 indicates a current supply pad. Even each part of these pads forms an aperture in an insulation layer and a passivation film.

The aperture for applying an organic light emitting layer that constitutes the light emission area of a pixel is arranged in a matrix shape corresponding to each pixel as shown in FIG. 11. Further, the reliability of a display module is improved by also providing an aperture unit in a sealing unit that turns around a display region AR as the need arises and improving the adhesion between a substrate and the sealing unit. Besides, an aperture that is a contact hole for connecting a second electrode layer to the bottom wiring layer is also formed.

Besides, the present invention is not limited to a display module that uses the OLED described above, and can also be applied to another display module that performs a display in the same light emission operation as the OLED.

As described above, according to the present invention, because the leakage current generated between a first electrode layer and a second electrode layer that constitute a pixel via an organic light emitting layer is prevented and the organic light emitting layer that constitutes the pixel is formed in uniform thickness and through a necessary and sufficient spread over the predetermined pixel region, a display module that enables a high quality display can be provided.

What is claimed is:

1. A display module, comprising:

a substrate;

wires including a plurality of scanning lines provided on the substrate, a plurality of data lines intersecting the plurality of scanning lines, and a plurality of current supply lines;

a plurality of pixel regions each of the plurality of pixel regions including an organic light emitting device arranged in the shape of matrix in the pixel regions surrounded by adjacent ones of the plurality of scanning lines on the substrated and adjacent ones of the plurality of data lines, and being supllied with current from the current supply lines;

an isolation layer electrically isolating the regions between the plurality of scanning lines and the plurality of lines;

wherein each of the plurality of pixel regions has a pixel circuit including a first active element which is turned on by one of the plurality of scanning lines so as to enable acquiring of a data signal from one of the plurality of data lines, a data holding element which holds the data signal, and a second active element which is turned on in accordance with the data signal held by the data holding element from the current supply lines by enabling the light emitting device to emit light;

wherein a recessed part in each of the plurality of pixel regions is formed by removal of a portion of an insulation layer and a passivation film;

wherein the organic light emitting element has a first electrode layer composed of a transparent conductive film formed so as to extend from an upper part of the passivation film of the pixel region to the recessed part and which is connected to the second active element through the passivation film;

wherein an organic light emitting layer formed on the first electrode layer in the recessed part, and a second electrode layer is formed on the organic light emitting layer; and wherein an interlayer insulation layer is formed so as to cover an inner wall of the recessed part between the first electrode layer and the second electrode layer of the organic light emitting element, and an aperture which accommodates the organic light emitting layer is formed in a recessed part of the interlayer insulation layer.

2. The display module according to claim 1, wherein the aperture in the interlayer insulation layer is formed in each of the plurality of pixel regions so as to bypass each of the lines.

3. The display module according to claim 1, wherein the interlayer insulation layer is formed by being coated with an acrylic resin.

4. The display module according to claim 1, wherein the insulation layer is provided in the second active element formed in each of the plurality of the pixel regions and includes a first insulation layer isolated by a polycrystalline silicon layer formed on the substrate and gate lines opposite to the polycrystalline silicon layer, and a second insulation layer which covers the gate lines, wherein the source lectrode of the second active element is formed on the second insulation layer, and the source electrode is connected to the polycrystalline silicon layer through a contact hole formed on the first insulation layer and the second insulation layer.

5. The display module according to claim 1, wherein the interlayer insulation layer is formed by coating all edges of the first electrode layer.

6. The display module according to claim 1, wherein the first electrode layer is formed using ITO.

7. The display module according to claim 1, wherein the organic emitting layer is formed by being coated with at least one of an inkjet system, mask printing system and spin coating system on the aperture of the interlayer insulation layer.

* * * * *